United States Patent [19]

Suzuki et al.

[11] Patent Number: 5,606,421

[45] Date of Patent: Feb. 25, 1997

[54] METHOD OF AND APPARATUS FOR ENCODING AND DECODING DIGITAL VIDEO SIGNALS BY REPRESENTING ORTHOGONAL TRANSFORM COEFFICIENTS WITH RESPECTIVE GROUP VALUES

[75] Inventors: Takao Suzuki; Shojiro Shibata, both of Kanagawa, Japan

[73] Assignee: Sony Corporation, Tokyo, Japan

[21] Appl. No.: 302,464

[22] Filed: Sep. 12, 1994

[30] Foreign Application Priority Data

Sep. 14, 1993 [JP] Japan .................................... 5-252584

[51] Int. Cl.$^6$ .............................. H04N 9/79; H04N 5/76; H04N 7/12; H04N 11/02
[52] U.S. Cl. ........................... 386/33; 358/335; 360/901; 348/403; 348/420; 386/109; 386/112
[58] Field of Search ..................................... 358/335, 310, 358/342; 360/9.1; 348/403, 404, 405, 408, 419, 420, 398, 397; 382/248–250; H04N 5/92

[56] References Cited

U.S. PATENT DOCUMENTS

| | | | |
|---|---|---|---|
| 4,734,767 | 3/1988 | Kaneko et al. | 358/133 |
| 5,107,345 | 4/1992 | Lee | 358/432 |
| 5,253,055 | 10/1993 | Civanlar et al. | 358/133 |
| 5,272,528 | 12/1993 | Juri et al. | 358/133 |
| 5,410,351 | 4/1995 | Kojima | 348/401 |
| 5,422,736 | 6/1995 | Katayama | 358/462 |

OTHER PUBLICATIONS

Woo Paik, Digicipher–All Digital., IEEE, 245–254 Dec. 1990.

*Primary Examiner*—Thai Q. Tran
*Assistant Examiner*—David R. Vincent
*Attorney, Agent, or Firm*—William S. Frommer; Alvin Sinderbrand

[57] ABSTRACT

Digital signals representing a video image are variable length encoded and decoded by representing a sequence of orthogonal transformation coefficients with respective group numbers that represent groups of values of zero run lengths or groups of values of effective AC coefficients within the sequence. Huffman code values are assigned for each effective AC coefficient or for each zero run length by referencing a set of Huffman coding tables in which the Huffman code values are stored according to the respective group number and its immediately preceding group number in the sequence. The most frequent group numbers are assigned the shortest length Huffman code values and the least frequent group numbers are assigned the greatest length Huffman code values.

46 Claims, 31 Drawing Sheets

FIG. 4
(PRIOR ART)

| GROUP NO. | AC COEFFICIENT | NUMBER OF ADDITIONAL BITS |
|---|---|---|
| 1 | −1, 1 | 1 |
| 2 | −3, −2, 2, 3 | 2 |
| 3 | −7~−4, 4~7 | 3 |
| 4 | −15~−8, 8~15 | 4 |
| 5 | −31~−16, 16~31 | 5 |
| 6 | −63~−32, 32~63 | 6 |
| 7 | −127~−64, 64~127 | 7 |
| 8 | −255~−128, 128~255 | 8 |
| 9 | −511~−256, 256~511 | 9 |
| 10 | −1023~−512, 512~1023 | 10 |
| 11 | −2047~−1024, 1024~2047 | 11 |
| 12 | −4095~−2048, 2048~4095 | 12 |
| 13 | −8191~−4096, 4096~8191 | 13 |
| 14 | −16383~−8192, 8192~16383 | 14 |
| 15 | −32767~−16384, 16384~32767 | 15 |

FIG. 5
(PRIOR ART)

EFFECTIVE COEFFICIENT
GROUP NUMBER

| ZERO RUN LENGTH | 0 | 1 | 2 | ... | 14 | 15 |
|---|---|---|---|---|---|---|
| EOB or 0 | | | | HUFFMAN CODE VALUE | | |
| 1 | | | | | | |
| 2 | | | | | | |
| ... | | | | | | |
| 14 | | | | | | |
| ≥15 | | | | | | |

FIG. 6A
(PRIOR ART)

| ITERATION | GROUP NUMBER | FREQUENCY OF OCCURRENCE | CODE |
|---|---|---|---|
| 1 | 8 | 45 | |
| | 1 | 21 | |
| | 13 | 20 | |
| | 49 | 19 | |
| | 7 | 5 | 1 |
| | 5 | 1 | 0 |

| ITERATION | GROUP NUMBER | FREQUENCY OF OCCURRENCE | CODE |
|---|---|---|---|
| 2 | 8 | 45 | |
| | 1 | 21 | |
| | 13 | 20 | |
| | 49 | 19 | 1 |
| | {7,5} | 6 | 0 |

| ITERATION | GROUP NUMBER | FREQUENCY OF OCCURRENCE | CODE |
|---|---|---|---|
| 3 | 8 | 45 | |
| | {7,5,49} | 25 | |
| | 1 | 21 | 1 |
| | 13 | 20 | 0 |

| ITERATION | GROUP NUMBER | FREQUENCY OF OCCURRENCE | CODE |
|---|---|---|---|
| 4 | 8 | 45 | |
| | {1,13} | 41 | 1 |
| | {7,5,49} | 25 | 0 |

| ITERATION | GROUP NUMBER | FREQUENCY OF OCCURRENCE | CODE |
|---|---|---|---|
| 5 | {7,5,49,1,13} | 66 | 1 |
| | 8 | 45 | 0 |

| TOKEN | VALUE |
|---|---|
| 0 | 8 |
| 1000 | 5 |
| 1001 | 7 |
| 101 | 49 |
| 110 | 13 |
| 111 | 1 |

FIG. 8

GROUPING TABLE Tg

| GROUP NO. | ZERO RUN LENGTH OR AC COEFFICIENT | NUMBER OF ADDITIONAL BITS |
|---|---|---|
| 0 | EOB | 0 |
| 1 | 0*1 | 0 |
| 2 | 0*2~0*3 | 1 |
| 3 | 0*4~0*7 | 2 |
| 4 | 0*8~0*15 | 3 |
| 5 | 0*16~0*31 | 4 |
| 6 | 0*32~0*63 | 5 |
| 7 | -1, 1 | 1 |
| 8 | -3, -2, 2, 3 | 2 |
| 9 | -7~-4  4~7 | 3 |
| 10 | -15~-8, 8~15 | 4 |
| 11 | -31~-16, 16~31 | 5 |
| 12 | -63~-32, 32~63 | 6 |
| 13 | -127~-64, 64~127 | 7 |
| 14 | -255~-128, 128~255 | 8 |
| 15 | -511~-256, 256~511 | 9 |
| 16 | -1023~-512, 512~1023 | 10 |
| 17 | -2047~-1024, 1024~2047 | 11 |

FIG. 9A

CODING TABLE SET GT1

T0 : FREQUENCY OF OCCURRENCE AND HUFFMAN CODE VALUE FOR THE FIRST GROUP NUMBER

| GROUP | FREQUENCY OF OCCURRENCE | WORD LENGTH | HUFFMAN CODE |
|---|---|---|---|
| 0 | 6 | 9 | 100100000 |
| 1 | 732 | 6 | 100101 |
| 2 | 96 | 7 | 1001001 |
| 3 | 19 | 9 | 100100001 |
| 7 | 1563 | 4 | 1000 |
| 8 | 2823 | 3 | 010 |
| 9 | 5482 | 3 | 111 |
| 10 | 5989 | 2 | 00 |
| 11 | 5289 | 3 | 110 |
| 12 | 4738 | 3 | 101 |
| 13 | 3327 | 3 | 011 |
| 14 | 1069 | 5 | 10011 |
| 15 | 67 | 8 | 10010001 |

FIG. 9B

CODING TABLE SET GT1

T1: FREQUENCY OF OCCURRENCE AND HUFFMAN CODE VALUE FOR GROUP NUMBERS IMMEDIATELY PRECEDED BY AN AC COEFFICIENT OF GROUP NUMBER 1

| GROUP | FREQUENCY OF OCCURRENCE | WORD LENGTH | HUFFMAN CODE |
|---|---|---|---|
| 7 | 697792 | 1 | 1 |
| 8 | 17668 | 2 | 01 |
| 9 | 5311 | 3 | 001 |
| 10 | 1877 | 4 | 0001 |
| 11 | 724 | 5 | 00001 |
| 12 | 243 | 6 | 000001 |
| 13 | 56 | 7 | 0000001 |
| 14 | 6 | 7 | 0000000 |

FIG. 9C

CODING TABLE SET GT1

T2 : FREQUENCY OF OCCURRENCE AND HUFFMAN CODE VALUE FOR GROUP NUMBERS IMMEDIATELY PRECEDED BY AN AC COEFFICIENT OF GROUP NUMBER 2

| GROUP | FREQUENCY OF OCCURRENCE | WORD LENGTH | HUFFMAN CODE |
|---|---|---|---|
| 7  | 55072 | 1 | 1 |
| 8  | 8033  | 2 | 01 |
| 9  | 1648  | 3 | 001 |
| 10 | 481   | 4 | 0001 |
| 11 | 149   | 5 | 00001 |
| 12 | 36    | 6 | 000001 |
| 13 | 19    | 6 | 000000 |

FIG. 9D

CODING TABLE SET GT1

T3 : FREQUENCY OF OCCURRENCE AND HUFFMAN CODE VALUE FOR GROUP NUMBERS IMMEDIATELY PRECEDED BY AN AC COEFFICIENT OF GROUP NUMBER 3

| GROUP | FREQUENCY OCCURRENCE | WORD LENGTH | HUFFMAN CODE |
|---|---|---|---|
| 7 | 32161 | 1 | 1 |
| 8 | 2240 | 2 | 01 |
| 9 | 537 | 3 | 001 |
| 10 | 101 | 4 | 0001 |
| 11 | 17 | 4 | 00000 |

FIG. 9E

CODING TABLE SET GT1

T4 : FREQUENCY OF OCCURRENCE AND HUFFMAN CODE VALUE FOR GROUP NUMBERS IMMEDIATELY PRECEDED BY AN AC COEFFICIENT OF GROUP NUMBER 4

| GROUP | FREQUENCY OF OCCURRENCE | WORD LENGTH | HUFFMAN CODE |
|-------|------------------------|-------------|--------------|
| 7     | 14489                  | 1           | 1            |
| 8     | 449                    | 2           | 01           |
| 9     | 113                    | 3           | 001          |
| 10    | 29                     | 4           | 0001         |
| 11    | 4                      | 4           | 0000         |

FIG. 9F

T5: FREQUENCY OF OCCURRENCE AND HUFFMAN CODE VALUE FOR GROUP NUMBERS IMMEDIATELY PRECEDED BY AN AC COEFFICIENT OF GROUP NUMBER 5

CODING TABLE SET GT1

| GROUP | FREQUENCY OF OCCURRENCE | WORD LENGTH | HUFFMAN CODE |
|---|---|---|---|
| 7 | 2794 | 1 | 1 |
| 8 | 69 | 2 | 01 |
| 9 | 21 | 3 | 001 |
| 10 | 2 | 3 | 000 |

FIG. 9G

T6: FREQUENCY OF OCCURRENCE AND HUFFMAN CODE VALUE FOR GROUP NUMBERS IMMEDIATELY PRECEDED BY AN AC COEFFICIENT OF GROUP NUMBER 6

CODING TABLE SET GT1

| GROUP | FREQUENCY OF OCCURRENCE | WORD LENGTH | HUFFMAN CODE |
|---|---|---|---|
| 7 | 58 | 1 | 1 |

FIG. 9H

CODING TABLE SET GT1

T7: FREQUENCY OF OCCURRENCE AND HUFFMAN CODE VALUE FOR GROUP NUMBERS IMMEDIATELY PRECEDED BY AN AC COEFFICIENT OF GROUP NUMBER 7

| GROUP | FREQUENCY OF OCCURRENCE | WORD LENGTH | HUFFMAN CODE |
|---|---|---|---|
| 0 | 282255 | 4 | 1010 |
| 1 | 639903 | 2 | 00 |
| 2 | 49110 | 3 | 100 |
| 3 | 30126 | 4 | 1011 |
| 4 | 13238 | 4 | 0100 |
| 5 | 2574 | 7 | 0101011 |
| 6 | 49 | 11 | 01010100001 |
| 7 | 1354403 | 2 | 11 |
| 8 | 435899 | 3 | 011 |
| 9 | 118857 | 5 | 01011 |
| 10 | 40944 | 6 | 010100 |
| 11 | 14426 | 8 | 01010101 |
| 12 | 5011 | 9 | 010101001 |
| 13 | 886 | 10 | 0101010001 |
| 14 | 17 | 12 | 010101000001 |
| 15 | 2 | 12 | 010101000000 |

FIG. 9I

CODING TABLE SET GT1

T8: FREQUENCY OF OCCURRENCE AND HUFFMAN CODE VALUE FOR GROUP NUMBERS IMMEDIATELY PRECEDED BY AN AC COEFFICIENT OF GROUP NUMBER 8

| GROUP | FREQUENCY OF OCCURRENCE | WORD LENGTH | HUFFMAN CODE |
|---|---|---|---|
| 0 | 923 | 8 | 00111110 |
| 1 | 18643 | 3 | 010 |
| 2 | 10630 | 3 | 000 |
| 3 | 3860 | 5 | 00110 |
| 4 | 1456 | 7 | 0011110 |
| 5 | 241 | 10 | 0011111101 |
| 6 | 8 | 13 | 0011111100001 |
| 7 | 47419 | 2 | 11 |
| 8 | 47388 | 2 | 10 |
| 9 | 18773 | 3 | 011 |
| 10 | 6098 | 4 | 0010 |
| 11 | 2270 | 6 | 001110 |
| 12 | 756 | 9 | 001111111 |
| 13 | 152 | 11 | 00111111001 |
| 14 | 26 | 12 | 001111110001 |
| 15 | 3 | 13 | 0011111110000 |

FIG. 9J

T9 : FREQUENCY OF OCCURRENCE AND HUFFMAN CODE VALUE FOR GROUP NUMBERS IMMEDIATELY PRECEDED BY AN AC COEFFICIENT OF GROUP NUMBER 9

CODING TABLE SET GT1

| GROUP | FREQUENCY OF OCCURRENCE | WORD LENGTH | HUFFMAN CODE |
|---|---|---|---|
| 0 | 95 | 10 | 0011010101 |
| 1 | 6916 | 3 | 000 |
| 2 | 3601 | 4 | 0010 |
| 3 | 788 | 7 | 0011011 |
| 4 | 305 | 8 | 00110100 |
| 5 | 54 | 11 | 00110101001 |
| 6 | 1 | 13 | 0011010100000 |
| 7 | 15891 | 3 | 101 |
| 8 | 21423 | 2 | 01 |
| 9 | 26413 | 2 | 11 |
| 10 | 9879 | 3 | 100 |
| 11 | 3200 | 5 | 00111 |
| 12 | 1115 | 6 | 001100 |
| 13 | 228 | 9 | 001101011 |
| 14 | 25 | 12 | 001101010001 |
| 15 | 5 | 13 | 0011010100001 |

FIG. 9K

CODING TABLE SET GT1

T10: FREQUENCY OF OCCURRENCE AND HUFFMAN CODE VALUE FOR GROUP NUMBERS IMMEDIATELY PRECEDED BY AN AC COEFFICIENT OF GROUP NUMBER 10

| GROUP | FREQUENCY OF OCCURRENCE | WORD LENGTH | HUFFMAN CODE |
|---|---|---|---|
| 0 | 9 | 11 | 00110100000 |
| 1 | 3143 | 4 | 0010 |
| 2 | 1401 | 6 | 001111 |
| 3 | 218 | 8 | 00110111 |
| 4 | 74 | 9 | 001101011 |
| 5 | 14 | 11 | 00110100001 |
| 6 | | | |
| 7 | 6810 | 3 | 100 |
| 8 | 8593 | 3 | 101 |
| 9 | 11870 | 2 | 01 |
| 10 | 16000 | 2 | 11 |
| 11 | 4977 | 3 | 000 |
| 12 | 1479 | 5 | 00110 |
| 13 | 291 | 7 | 0011100 |
| 14 | 36 | 10 | 0011101001 |

FIG. 9L

CODING TABLE SET GT1

T11: FREQUENCY OF OCCURRENCE AND HUFFMAN CODE VALUE FOR GROUP NUMBERS IMMEDIATELY PRECEDED BY AN AC COEFFICIENT OF GROUP NUMBER '11'

| GROUP | FREQUENCY OF OCCURRENCE | WORD LENGTH | HUFFMAN CODE |
|---|---|---|---|
| 1  | 1439  | 5  | 11011 |
| 2  | 416   | 7  | 1101011 |
| 3  | 36    | 9  | 110101011 |
| 4  | 1     | 10 | 1101010101 |
| 5  | 3     | 10 | 1101010100 |
| 7  | 29923 | 3  | 010 |
| 8  | 39985 | 3  | 011 |
| 9  | 48825 | 3  | 111 |
| 10 | 64448 | 2  | 00 |
| 11 | 74486 | 2  | 10 |
| 12 | 23307 | 4  | 1100 |
| 13 | 471   | 6  | 110100 |
| 14 | 39    | 8  | 11010100 |

FIG. 9M

CODING TABLE SET GT1

T12: FREQUENCY OF OCCURRENCE AND HUFFMAN CODE VALUE FOR GROUP NUMBERS IMMEDIATELY PRECEDED BY AN AC COEFFICIENT OF GROUP NUMBER 12

| GROUP | FREQUENCY OF OCCURRENCE | WORD LENGTH | HUFFMAN CODE |
|---|---|---|---|
| 1 | 643 | 6 | 111111 |
| 2 | 136 | 7 | 1111101 |
| 3 | 5 | 8 | 11111000 |
| 7 | 1250 | 4 | 1110 |
| 8 | 1717 | 3 | 100 |
| 9 | 2111 | 3 | 101 |
| 10 | 2697 | 3 | 110 |
| 11 | 3358 | 2 | 01 |
| 12 | 3017 | 2 | 00 |
| 13 | 650 | 5 | 11110 |
| 14 | 61 | 8 | 11111001 |

FIG. 9N

CODING TABLE SET GT1

T13: FREQUENCY OF OCCURRENCE AND HUFFMAN CODE VALUE FOR GROUP NUMBERS IMMEDIATELY PRECEDED BY AN AC COEFFICIENT OF GROUP NUMBER 13

| GROUP | FREQUENCY OF OCCURRENCE | WORD LENGTH | HUFFMAN CODE |
|---|---|---|---|
| 1 | 221 | 5 | 01101 |
| 2 | 43 | 7 | 0110001 |
| 3 | 2 | 8 | 01100001 |
| 7 | 384 | 4 | 0111 |
| 8 | 591 | 3 | 010 |
| 9 | 806 | 3 | 101 |
| 10 | 970 | 3 | 110 |
| 11 | 1186 | 2 | 00 |
| 12 | 1166 | 3 | 111 |
| 13 | 762 | 3 | 100 |
| 14 | 62 | 6 | 011001 |
| 15 | 1 | 8 | 01100000 |

FIG. 90

CODING TABLE SET GT1

T14: FREQUENCY OF OCCURRENCE AND HUFFMAN CODE VALUE FOR GROUP NUMBERS IMMEDIATELY PRECEDED BY AN AC COEFFICIENT OF GROUP NUMBER 14

| GROUP | FREQUENCY OF OCCURRENCE | WORD LENGTH | HUFFMAN CODE |
|---|---|---|---|
| 1 | 36 | 6 | 101101 |
| 2 | 5 | 7 | 1011001 |
| 3 | 2 | 7 | 1011000 |
| 7 | 73 | 4 | 1010 |
| 8 | 121 | 4 | 1110 |
| 9 | 164 | 3 | 100 |
| 10 | 236 | 3 | 110 |
| 11 | 284 | 2 | 01 |
| 12 | 273 | 2 | 00 |
| 13 | 147 | 4 | 1111 |
| 14 | 49 | 5 | 10111 |

FIG. 9P

T15: FREQUENCY OF OCCURRENCE AND HUFFMAN CODE VALUE FOR GROUP NUMBERS IMMEDIATELY PRECEDED BY AN AC COEFFICIENT OF GROUP NUMBER 15

CODING TABLE SET GT1

| GROUP | FREQUENCY OF OCCURRENCE | WORD LENGTH | HUFFMAN CODE |
|---|---|---|---|
| 1 | 1 | 4 | 0000 |
| 7 | 8 | 3 | 001 |
| 8 | 8 | 3 | 010 |
| 9 | 9 | 3 | 011 |
| 10 | 14 | 3 | 111 |
| 11 | 19 | 2 | 10 |
| 12 | 4 | 3 | 110 |
| 13 | 5 | 4 | 0001 |

FIG. 9Q

CODING TABLE SET GT1

T16: FREQUENCY OF OCCURRENCE AND HUFFMAN CODE VALUE FOR GROUP NUMBERS IMMEDIATELY PRECEDED BY AN AC COEFFICIENT OF GROUP NUMBER 16

| GROUP | FREQUENCY OF OCCURRENCE | WORD LENGTH | HUFFMAN CODE |
|---|---|---|---|
| | ALL φ | | |

FIG. 9R

CODING TABLE SET GT1

T17: FREQUENCY OF OCCURRENCE AND HUFFMAN CODE VALUE FOR GROUP NUMBERS IMMEDIATELY PRECEDED BY AN AC COEFFICIENT OF GROUP NUMBER 17

| GROUP | FREQUENCY OF OCCURRENCE | WORD LENGTH | HUFFMAN CODE |
|---|---|---|---|
| | ALL φ | | |

FIG. 10A   HUFFMAN CODING TABLE SET GT2

| TABLE NO. | Tx0 | Tx1 | Tx7 | Tx8 | Tx9 |
|---|---|---|---|---|---|
| PRECEDING GROUP NO. | 0 | 1, 2, 3, 4, 5, 6 | 7 | 8 | 9 |
| GROUP 0 | 1001001010 | | 1010 | 0011110 | 0010101000 |
| 1 | 100101 | | 00 | 010 | 000 |
| 2 | 1001000 | | 100 | 000 | 0010 |
| 3 | 100100100 | | 1011 | 00110 | 0011011 |
| 4 | 1001001011110 | | 0100 | 0011110 | 00110100 |
| 5 | 100100101101 | | 0101011 | 0011111101 | 00110101 |
| 6 | 100100101100 | 1 | 010101000001 | 00111111100000 | 00110101010010 |
| 7 | 1000 | 01 | 11 | 11 | 101 |
| 8 | 010 | 001 | 011 | 10 | 01 |
| 9 | 111 | 0001 | 01011 | 011 | 11 |
| 10 | 00 | 00001 | 010100 | 0010 | 100 |
| 11 | 110 | 000001 | 0101010 | 001110 | 00111 |
| 12 | 101 | 0000001 | 01010100 | 00111111 | 001100 |
| 13 | 011 | 00000001 | 0101010001 | 001111111001 | 001101011 |
| 14 | 10011 | 000000001 | 01010100001 | 00111111110001 | 0011010101011 |
| 15 | 1001011 | 0000000001 | 010101000000 | 001111111000011 | 00110101010100 |
| 16 | 100100101111 | 00000000001 | 0101010000011 | 00111111100000101 | 00110101010001111 |
| 17 | 1001001011101 | 000000000001 | 010101000000101 | 001111111000001001 | 00110101010011011 |

FIG. 10B  FIXED CODING TABLE SET GT2 (CONTINUED)

| TABLE NO. | Tx10 | Tx11 | Tx12 | Tx13 | Tx14 | Tx15 |
|---|---|---|---|---|---|---|
| PRE-GROUP | 10 | 11 | 12 | 13 | 14 | 15, 16, 17 |
| GROUP 0 | 001110101110 | 110101001001 | 111110001111 | 100001011 | 00000101 | 0110 |
| 1 | 0010 | 11011 | 111111 | 10001 | 10100 | 0111 |
| 2 | 001111 | 110101 | 111101 | 1000011 | 000001 | 0101 |
| 3 | 001110111 | 110101010 | 111110010 | 1000010000 | 0000110 | 1110 |
| 4 | 001110100 | 110101011 | 111110010 | 100001010 | 0000100 | 1101 |
| 5 | 001110110 | 110101000 | 111110000 | 100001001 | 0000001 | 1100 |
| 6 | 001110101111 | 110101000011 | 111110000001 | 1000010001 | 00001111 | 10101 |
| 7 | 100 | 010 | 1110 | 1001 | 0001 | 1011 |
| 8 | 101 | 011 | 100 | 010 | 1011 | 1100 |
| 9 | 01 | 111 | 101 | 101 | 100 | 1101 |
| 10 | 11 | 00 | 110 | 110 | 110 | 000 |
| 11 | 000 | 10 | 01 | 00 | 01 | 100 |
| 12 | 00110 | 1100 | 00 | 111 | 111 | 001 |
| 13 | 001100 | 110100 | 11110 | 011 | 001 | 0100 |
| 14 | 001101010 | 110101011 | 111111001 | 100000 | 10101 | 111111 |
| 15 | 001110101110 | 110101000010 | 111110000000 | 10000100010 | 00001110 | 111110 |
| 16 | 001110101101 | 110101001001 | 111110000101 | 1000010010 | 00000001 | 101001 |
| 17 | 001110101001 | 110101001001 | 111110000001 | 10000101001 | 00000000 | 101000 |

FIG. 12B

| | | | | | | | | |
|---|---|---|---|---|---|---|---|---|
| (a) ZIGZAG SCAN | 53, | -20, | 0, | -1, | -1, | 0*4, | 1, | 0*5(EOB) |
| (b) GROUPING | 53, | -20, | 0*1, | 1, | -1, | -1, | 1, | 0*5(EOB) |
| (c) GROUP NUMBER | 12, | 11, | 1, | 7, | 7, | 3, | 7, | 3 |
| (d) DELAYED GROUP NUMBER | 0, | 12, | 11, | 1, | 7, | 7, | 3, | 7 |
| (e) CODING TABLE NUMBER Tx | Tx0, | Tx12, | Tx11, | Tx1, | Tx7, | Tx7, | Tx1, | Tx7 |
| (f) HUFFMAN CODE | 101, | 01, | 11011, | 1, | 11, | 1011, | 1, | 1011, |
| (g) ADDITIONAL BITS | 010101, | 10100, | —, | 0, | 1, | 00, | 0, | 01, |
| (h) VARIABLE LENGTH CODE | 10101101, | 010100, | 11011, | 10, | 111, | 101100, | 10, | 101101, |

METHOD OF AND APPARATUS FOR ENCODING AND DECODING DIGITAL VIDEO SIGNALS BY REPRESENTING ORTHOGONAL TRANSFORM COEFFICIENTS WITH RESPECTIVE GROUP VALUES

BACKGROUND OF THE INVENTION

The present invention relates to methods of and apparatus for coding and decoding that are used for transmitting, recording or reproducing digital video signals and, more particularly, to variable length encoding and decoding of the digital signals.

In a known video transmission system or video recording and reproducing apparatus, such as a video tape recorder (VTR), digital signals representing a video image are compressed and encoded according to a generic coding standard, such as the JPEG standard. Typically, the digital signals are orthogonally transformed and quantized and then variable length encoded to compress the digital signals and reduce the amount of data needed to represent the video image.

As shown in FIG. 1, for example, digital signals representing a portion of a video image are supplied via input terminal 11 to a discrete cosine transform (DCT) circuit 1 which transforms the portion of the image from the time domain into the frequency domain to reduce spatial redundancy within the video image. The portion of the video image, such as a block of 8 horizontal pixels width by 8 vertical pixels height, is converted by DCT transformation from a block representing luminance or chrominance amplitudes into a block of 8 by 8 frequency coefficients to form a sequence of 64 coefficients representing respective frequencies contained in the block. The first coefficient is referred to as the DC coefficient, while the remaining 63 coefficients are referred to as the AC or high frequency coefficients. Typically, a block of pixels representing a solid portion of a video image is transformed into a DC coefficient indicating the amplitude of the solid portion and into no non-zero value AC coefficients. By contrast, a block of pixels representing a highly detailed image portion is transformed into coefficient data having many non-zero AC coefficients.

The DCT circuit 1 supplies the DCT coefficients to a quantization circuit (quantizer) 2 that quantizes the DCT coefficient data with quantization steps selected as a function of the volume of data represented by the DCT transformation coefficients and supplies the quantized data to a scan converter circuit 3.

FIG. 2 illustrates the operation of the scan converter circuit 3. As shown in FIG. 2, the 64 DCT coefficients of each block supplied by the DCT circuit 2 correspond to various combinations of 8 horizontal spatial frequencies and 8 vertical spatial frequencies. The DCT coefficient having the lowest horizontal spatial frequency (0) and the lowest vertical spatial frequency (0), namely the DC coefficient, is represented by the region in the left uppermost corner. The remaining regions represent the 63 AC coefficients.

The scan converter circuit 3 arranges the 63 AC coefficients of each block into a sequence that starts from the AC coefficient representing the lowest horizontal and vertical spatial frequency and proceeds as a function of increasing horizontal and vertical spatial frequency, as represented by the zigzag pattern shown in FIG. 2. The scan converter circuit 3 supplies the DC coefficient and the sequence of AC coefficients to a variable length encoder circuit 4, shown in FIG. 1, which encodes the data using a variable length code.

The variable length encoder circuit 4 segregates the DC coefficient of each block from the sequence of AC coefficients and variable length encodes the AC and DC coefficients independently using a known arithmetic code such as a Huffman code.

FIG. 3 is a block diagram showing in greater detail the AC encoding portion of the variable length encoding circuit 4. As shown in FIG. 3, the AC coefficients arranged by scan converter circuit 3 are supplied to a zero decision circuit 41 which determines whether a respective AC coefficient has a zero value. The decision circuit 41 supplies AC coefficients having a zero value to run length counter 42 which counts successive zero value AC coefficients. The run length counter 42 supplies the count of successive zero value AC coefficients, known as a zero run length, to a two-dimensional Huffman encoder circuit 44. The zero run length has a maximum run of 15. If the count of successive zero value AC coefficients exceeds 15, the run length counter 42 supplies a flag ZRL to the encoder circuit 44 for every 16 successive zero value AC coefficients, followed by a zero run length representing the count of the remaining successive zero value AC coefficients.

Likewise, the decision circuit 41 delivers the AC coefficients having a non-zero value, known as effective AC coefficients, to a grouping circuit 43. The grouping circuit 43 groups the effective AC coefficients according to a predefined grouping table as shown, for example, in FIG. 4. The values of the AC coefficients are grouped in the table according to a respective group number which is the number of binary bits needed to represent the absolute value of the AC coefficient. The group number corresponding to each effective coefficient, as well as additional bits which represent the ordinal position of the AC coefficient within its respective group, are assigned to the coefficient. As an example, an AC coefficient having the value "−1" is assigned the group number 1 , as well as an additional bit which indicates that the value is the lower of the two values in the group. By contrast, an AC coefficient having a value "1" is also assigned the group number 1 but is assigned an additional bit indicating that the value is the greater value in the group. As a further example, an AC coefficient having the value "4" is assigned the group number 3 and three additional bits indicating that the value is the fifth value in the group.

The grouping circuit 43 supplies the respective group numbers for each effective AC coefficient to the two-dimensional Huffman encoder 44 which assigns a Huffman code value to each effective AC coefficient by referencing a previously generated two-dimensional Huffman coding table stored in coding table memory 45.

The two-dimensional Huffman coding table stored in coding table memory 45 is generated as a function of the frequency of occurrence of a respective combination of a group number and its immediately preceding zero run length as shown, for example, in FIG. 5. As an example of the generation of a Huffman coding table, FIG. 6A shows the iterative steps of forming a one-dimensional Huffman coding table by repeatedly determining the group numbers having the lowest frequencies of occurrence. In the first iteration, the least frequent group number, 5, is assigned a one-bit code of "zero" and the next least frequent group number, 7, is assigned a one-bit code of "one". The two group numbers are then combined to form a composite group number, {7, 5}, having the combined frequencies of the two group numbers, 6, and reordered to redetermine the two group numbers or composite group numbers having the least frequency of occurrence. The steps of assigning a one-bit code to the two group numbers and/or composite group numbers having the least frequencies of occurrence, combining the two numbers and then reordering the group numbers and composite group numbers are repeated until only one composite group number remains. Each of the original group numbers is thus assigned a sequence of "ones" or "zeros" shown in FIG. 6B, which represent the sequence by which each respective group value was combined into increasingly larger composite group numbers. FIG. 6C illustrates a tree structure showing how the group numbers are combined and by which the order of the group numbers as a function of frequency of occurrence can be reconstructed from the Huffman codes during subsequent decoding.

The two-dimensional Huffman coding table is generated in an analogous manner using predetermined frequency of occurrence values for each respective combination of the group number and the zero run length. The encoder 44 references the two-dimensional Huffman coding table and assigns Huffman code values as a function of a respective effective coefficient in the sequence of AC coefficients and its immediately preceding zero run length value. In a portion of a sequence of AC coefficients having values "0, 0, 1, 4", for example, the effective AC coefficient "1" corresponds to group number "1", as shown in FIG. 4, and is immediately preceded by a zero run length "2". The encoder 44 references the two-dimensional Huffman coding table shown in FIG. 5 and assigns the Huffman code value corresponding to group number "1" and zero run length "2" to the effective coefficient. Likewise, the effective AC coefficient "4" in this sequence corresponds to group number "3" and is immediately preceded by a zero run length "0" and the encoder circuit 44 assigns the Huffman code value corresponding to group number "3" and zero run length "0". If one or more ZRL flags precede the zero run length value, the encoder circuit 44 assigns the Huffman code value corresponding to the appropriate group number and zero run length "15".

The Huffman code assigned to each effective AC coefficient by the encoder circuit 44 and the corresponding respective additional bits generated by the grouping circuit 43 are combined and delivered to a formatting circuit 5 which formats the signals for subsequent transmission or recording on a recording medium via output terminal 12.

When the last AC coefficient of the block has a zero value, the variable length encoding circuit 4 appends an end of block indicator flag EOB to the sequence of Huffman codes and additional bits.

The DC coefficients are encoded by the variable length encoding circuit 4 by first determining the difference between the values of the DC coefficients of a pair of successive blocks of either luminance or chrominance signals. The encoding circuit 4 then groups the respective differences, known as difference values, by referencing a predefined grouping table similar to the table shown in FIG. 4, and assigns a group number and additional bits to each respective difference value. The respective group numbers are coded by referencing a previously generated one-dimensional Huffman coding table that is generated in the above-described manner, and the code data are delivered to the formatting circuit 5.

FIG. 7 illustrates a known arrangement for decoding variable length encoded signals that have been encoded in the above-described manner and that have been reproduced from a recording medium or transmitted and received. The variable length encoded signals are supplied to an input terminal 6 and delivered to a variable length code decoder 7. The variable length code decoder 7 decodes the variable length code signals by referencing a data table corresponding to the table shown in FIG. 5 and determines the group number of respective effective AC coefficients as well as the number of successive zero value coefficients that immediately precede the effective AC coefficient from the Huffman code value. The decoder 7 then determines the value of the effective AC coefficients from the group number and the additional bits. The variable length code decoder 7 also decodes the DC coefficients from the variable length code signals and supplies the DC coefficient and the AC coefficients for each block to a quantization decoder 8.

The quantization decoder 8 decodes the DC coefficient and the AC coefficients and supplies the quantization decoded coefficients to an inverse transform circuit 9. The inverse transform circuit 9 transforms each block of quantization decoded coefficients from the frequency domain into the time domain to form digital signals which are supplied to an output terminal 10 for subsequent reproduction.

The conventional encoding method described above has the drawback that the size of the coding table memory 45 limits the size of the two-dimensional Huffman coding table to coding values that correspond to zero run lengths of at most 15. Thus, the effective AC coefficients that are preceded by larger zero run lengths are not optimally encoded. Though the Huffman coding table can be expanded to include combinations representing larger zero run lengths, the size of the Huffman coding table can not be increased without significantly increasing the size of the memory.

Further, the same two-dimensional Huffman coding table is referenced regardless of whether the DCT coefficients represent luminance or chrominance signals. The coding table is not optimized to conform with the specific attributes of the luminance portion or the chrominance portion of the video image and, as a result, neither the variable length encoded signal representing the luminance signal or representing the chrominance signal is optimally compressed.

Also because variable length encoded signals are not optimally compressed, the maximum length of the signals is unnecessarily long and requires excessive memory.

OBJECTS AND SUMMARY OF THE INVENTION

Therefore, an object of the present invention is to provide apparatus and methods for encoding digital signals which avoid the aforementioned disadvantages of the related art.

An additional object of the present invention is to provide apparatus and methods for encoding digital signals which more efficiently compress the signals.

A further object of the present invention is to provide apparatus and methods for encoding digital signals in which the length of the variable length coded signals is minimized.

A still further object of the present invention is to provide apparatus and methods for encoding digital signals in which coding tables are employed that are respectively optimized for one of the luminance and chrominance signals.

Another object of the present invention is to provide apparatus and methods for encoding digital signals in which the size of the coding table is minimized.

In accordance with an aspect of this invention, a method of and an apparatus for encoding digital signals that represent a video image orthogonally transforms a part of the digital signals to generate plural transformation coefficients. A portion of these transformation coefficients are arranged in a predetermined order and each is represented by a group value that corresponds to one group of a set of predefined groups. The set of predefined groups includes groups formed of possible ranges of values of zero run lengths representing successive zero value transformation value coefficients. The set of predefined groups also includes groups formed of respective ranges of values of the non-zero value transformation coefficients. A data table that was generated as a function of the frequency of occurrence of a potential combination of the group value and a corresponding prior group value is provided. The corresponding prior group value represents the group value of the transformation coefficient that immediately precedes a respective transformation coefficient in the predetermined order. A coding value from the data table is assigned to each transformation coefficient as a function of its respective group value and its respective corresponding prior group value.

In accordance with this aspect of the invention, the orthogonally transformed digital signals are discrete cosine transformed (DCT) to generate a DC coefficient and AC coefficients. The AC coefficients may be arranged in order of spatial frequency.

In further accordance with this aspect, the transformation coefficients may be quantized. Further, successive transformation coefficients that have a value of zero may be counted to generate the zero run lengths. Moreover, the data table may include combinations wherein the prior group values that represent several ranges of zero run lengths correspond to an identical coding value for a respective group value. Also, the combinations of group value and corresponding prior group value that have lower frequencies of occurrence may correspond to an identical coding value.

Also in accordance with this aspect of the invention, a Huffman code value may be assigned for each transformation coefficient. Moreover, the coding value may comprise a first segment derived from the data table as a function of the respective group value and the prior group value and a second segment which indicates an ordinal position within the corresponding group of a value of the transformation coefficient. The second segment may comprise a predetermined number of bits that increases in length with decreasing frequency of occurrence of the value of the transformation coefficient. The first segment may include the Huffman code value and a length indicator which represents the length of the Huffman code value.

In accordance with a further object of the present invention, a method of and an apparatus for recording digital signals that represent a video image encodes the digital signals in the above-described manner. The coded signals are formatted and recorded on a recording medium.

In accordance with a still further object of the present invention, a method of and an apparatus for transmitting digital signals that represent a video image encodes the digital signals in the above-described manner and formats and transmits the coded signals.

In accordance with an additional aspect of this invention, a method of and an apparatus for decoding digital signals that represent a video image recovers coding values from a portion of the digital signals. Respective group values are determined from a prederived data table as a function of respective coding values and from a delayed group value. The group values correspond to one group of a set of predefined groups. Orthogonal transformation coefficients are generated as a function of the respective coding value and the respective group value, and the orthogonal transformation coefficients are inverse orthogonally transformed to generate a decoded digital video signal.

In accordance with this aspect of the present invention, each coding value may comprise a first segment which includes a Huffman code value and a length indicator that are used to determine the group values, and may comprise a second segment which indicates an ordinal position within the corresponding group so that orthogonal transformation coefficients may be derived from the second segment and the group value. Further, the prederived data table may be generated as a function of the frequency of occurrence of a combination of the group value and the delayed group value.

In accordance with a still additional aspect of the present invention, a method of and an apparatus for reproducing digital signals recorded on a record medium in the form of formatted signals that represent a video image reads the formatted signals from the record medium and decodes the digital signals in the above-described manner.

In accordance with a still further aspect of this invention, a method of and an apparatus for reproducing digital signals from signals transmitted in the form of formatted signals that represent a video image receives the formatted signals and decodes the formatted signals in the above-described manner.

As a further aspect of the present invention digital signals representing a video image are recorded and reproduced.

The above, and other objects, features and advantages of the present invention will be apparent from the following detailed description of the preferred embodiments of the present invention when read in conjunction with the accompanying drawings in which corresponding parts are identified by the same reference numeral.

BRIEF DESCRIPTION OF THE DRAWINGS

The following detailed description, given by way of example and not intended to limit the present invention solely thereto, will best be appreciated in conjunction with the accompanying drawings, wherein like reference numerals denote like elements and parts, in which:

FIG. 4 is a diagram illustrating a grouping table used in the operation of the known digital signal encoding method;

FIG. 5 is a diagram illustrating a two-dimensional Huffman coding table;

FIGS. 6A–6C are diagrams referred to in explaining the generation of a Huffman coding table;

FIG. 8 is a diagram showing a grouping table used in an embodiment of the present invention;

FIGS. 9A–9R are diagrams of tables showing, for each immediately preceding group number, the Huffman code value as a function of the group number;

FIGS. 10A–10B are diagrams showing a one-dimensional Huffman coding table referenced by an embodiment of the present invention;

FIGS. 12A–12B are diagrams referred to in explaining an example of variable length coding according to the circuit of FIG. 11.

DETAILED DESCRIPTION OF THE PREFERRED EMBODIMENT

Figure 1:
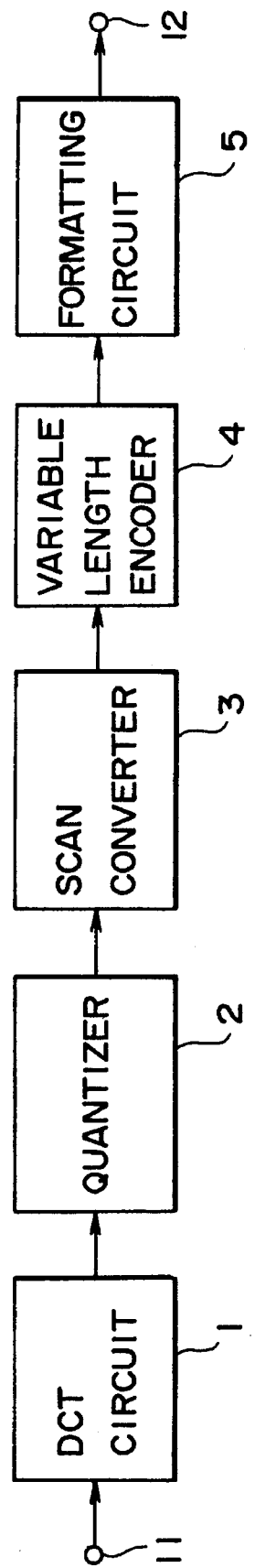
FIG. 1 is a block diagram showing a known digital video signal encoding apparatus.
Figure 2:
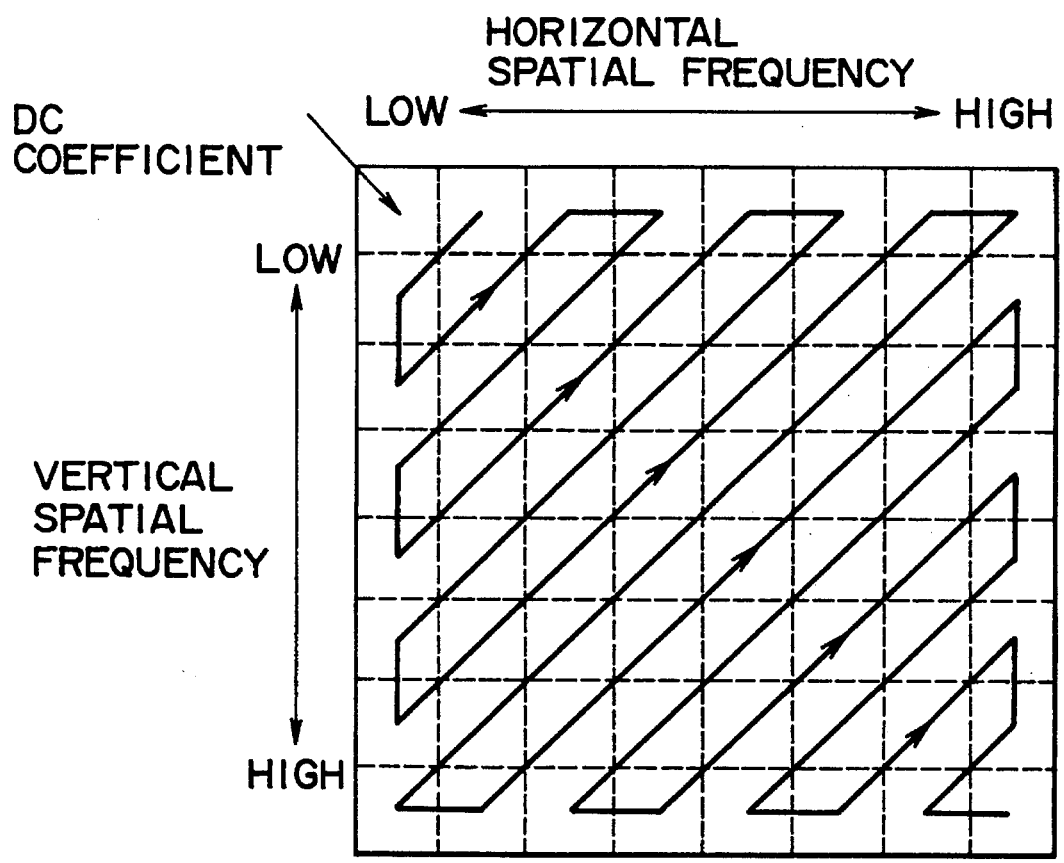
FIG. 2 is a diagram illustrating the relation of a block of DCT coefficients to horizontal and vertical spatial frequency.
Figure 3:
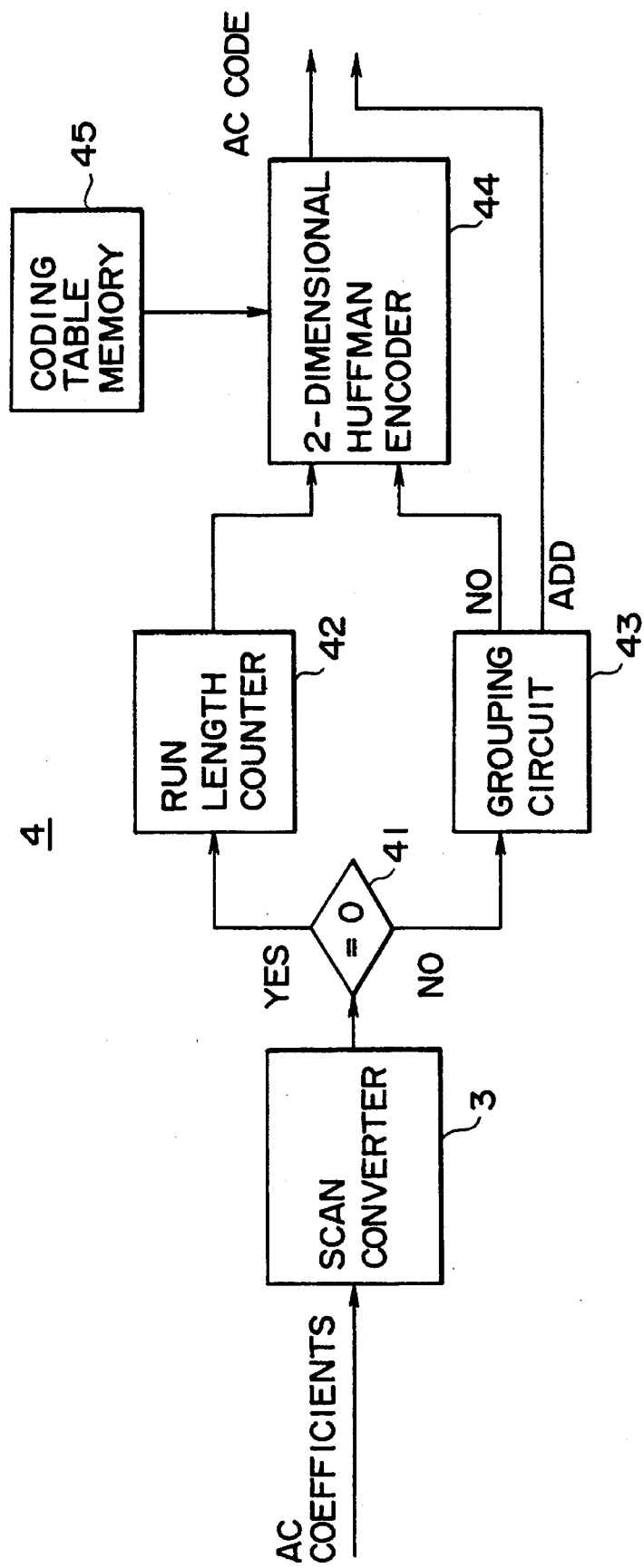
FIG. 3 is a block diagram showing the variable length encoder of FIG. 1 in greater detail.
Figures 6B, 6C:
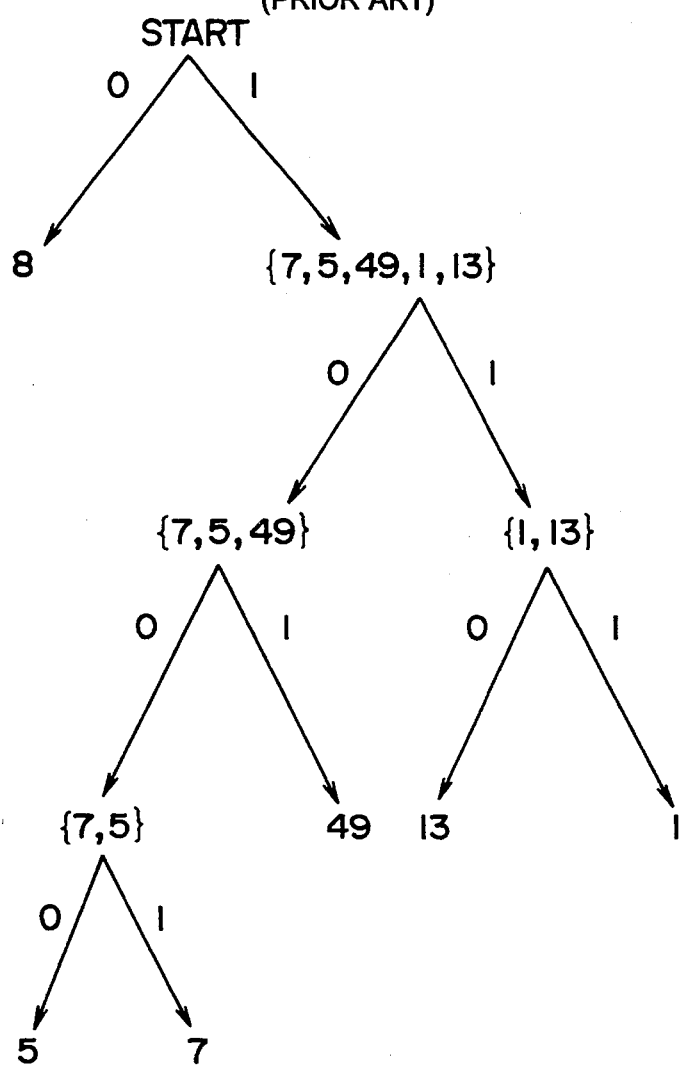

The present invention variable length encodes and decodes digital signals representing a video image by representing a sequence of orthogonal transformation coefficients with respective group numbers that represent either groups of values of zero run lengths or groups of values of effective AC coefficients and then assigning a Huffman code value for each coefficient by referencing a reduced size coding table in which the Huffman code values are stored according to the group number and its immediately preceding group number within the sequence.

FIG. 8 shows an example of a grouping table Tg used in an embodiment of the present invention to group the ranges of zero run lengths and the ranges of values of effective AC coefficients. The grouping table may be stored in a conventional storage circuit, such as a ROM or other addressable memory. As shown in FIG. 8, the group represented by group number "0" is comprised of the end of block flag EOB. Because group number "0" is comprised of only one element, no additional bits are necessary to indicate the ordinal position of the EOB flag within the group.

The group represented by group numbers "1" to "6" are comprised of respective ranges zero run lengths, shown in FIG. 8. The groups are arranged such that the number of zero run lengths within each respective group increases with increasing group number so that a corresponding increased number of additional bits represents the ordinal position of a zero run length within the respective group.

As an example, the group represented by the group number "1" is comprised of the zero run length of "1", which is the zero run length having the greatest frequency of occurrence, and no additional bits are required to represent the ordinal position. The group represented by the group number "2" is comprised of zero run lengths of "2" and "3", which are the run lengths having the next greatest frequencies of occurrence, and one additional bit serves to indicate the ordinal position within the group. Similarly, the group represented by group number "3" is comprised of zero run lengths "4" to "7", which represent the zero run lengths having the next greatest frequencies of occurrence, and require two additional bits to represent the ordinal position within the group. With each successive group number, the group represented is comprised of a larger number of zero run lengths which have lesser frequencies of occurrence than the zero run lengths of the preceding group and which require a greater number of additional bits to represent the ordinal position within the group. As a result of this arrangement, the variable length codes which correspond to the more frequently occurring zero run lengths have fewer additional bits, and thus require less memory for storage, than the variable length codes which correspond to less frequently occurring zero run lengths.

The groups represented by group numbers "7" to "17", shown in FIG. 8, are comprised of respective ranges of values of effective AC coefficients and correspond to group numbers "1" to "11" of the grouping table shown in FIG. 4. At most, eleven additional bits are required to represent the ordinal position of the AC coefficient, whereas, according to the JPEG standard, up to 15 additional bits are required.

FIG. 9 illustrates an example of a set of Huffman coding tables GT1 comprised of a series of tables T0 to T17, these tables being shown in FIGS. 9A–9R and stored in a suitable addressable memory. The Huffman code values stored in tables T0 to T17 are a function of the frequency of occurrence of a respective combination of a group number that represents one of the sequence of AC coefficients and the group number that represents its immediately preceding AC coefficient.

Table T0, shown in FIG. 9A, shows the frequency of occurrence, the Huffman code value and the word length of the Huffman code value for the group number representing the first effective AC coefficient or zero run length in the sequence of AC coefficients.

Each of tables T1 to T17, shown in FIGS. 9B–9R, shows the frequency of occurrence, the Huffman code and its word length for the group number representing a succeeding effective AC coefficient or zero run length as a function of the group number representing the immediately preceding effective AC coefficient or zero run length in the sequence. As an example, table T1, shown in FIG. 9B, represents group numbers that are immediately preceded by a zero run of length "0", namely a group "1" zero run length. Similarly, table T2, shown in FIG. 9C, represents the group numbers that are immediately preceded by a zero run of length "2" or "3", namely a group number "2" zero run length.

The Huffman code values of each table are such that the shortest Huffman code values are assigned to the group numbers that are most likely to succeed the immediately preceding group number of the table. The AC coefficients most likely to succeed a zero run length, namely the AC coefficients of group numbers "1" to "6", have the values "−1" or "1", namely the AC coefficients of group number "7"; thus, the shortest Huffman code values in tables T1 to T6 are assigned to group number "7", as shown in FIGS. 9B–9G. Similarly, the AC coefficient most likely to succeed an effective AC coefficient, namely the AC coefficients of group numbers "7" to "17", are the AC coefficients having a group number nearest in value to the immediately preceding group number; and these group numbers are assigned the shortest Huffman code values. Conversely, the group numbers having the least frequency of occurrence are assigned the Huffman code values of greatest length.

As an example, in table T7, shown in FIG. 9H, which represents the Huffman code values of group numbers that are immediately preceded by a coefficient of the group number "7", the shortest Huffman code values are assigned to group numbers "7" and "8". Similarly, in table T8, shown in FIG. 9I, which represents the Huffman code values for respective group numbers that are immediately preceded by a coefficient of the group number "8", the shortest Huffman code values are assigned to group numbers "7", "8" and "9".

By assigning the shortest length Huffman code values to the group numbers of greatest frequency of occurrence, the length of a variable length code formed of the Huffman code values is minimized.

The frequencies of occurrence shown in tables T0 to T17 of FIGS. 9A–9R are determined for a particular type of setting of a video image, such as a stadium setting for a sports event, and are suitable only for encoding digital signals representing video images of scenes at the particular setting. FIGS. 10A–10B show a set of Huffman coding tables GT2 in which the frequencies of occurrence, from which the Huffman code values stored therein are provided, are determined from many types of image settings and are suitable for encoding digital signals representing video images of any type of setting. The Huffman code values are referenced in the same manner as the Huffman code values of tables T0 to T17, namely as a function of a respective group number and its immediately preceding group number. Likewise, the shortest Huffman code values are assigned to the group numbers having the greatest frequency of occurrence, and the longest Huffman code values are assigned to the group numbers having the least frequency of occurrence.

FIGS. 10A–10B show the respective arrangements of Huffman coding tables Tx0 to Tx1 and Tx7 to Tx15 which form the set GT2.

Table Tx0 includes the respective Huffman code values of the group numbers that are immediately preceded by a group number "0" value, namely an end of block flag EOB.

Table Tx1 includes the Huffman code values of the group numbers that. are immediately preceded by a zero run length, namely group numbers "1" to "6". By definition, group numbers "1" to "6" are never preceded by a zero run length and thus only group numbers "7" to "17" are included in the table Tx1. Table Tx1 represents all lengths of zero runs that immediately precede an effective AC coefficient because the Huffman code values do not change as a function of the length of the immediately preceding zero run, as shown, for example, in tables T1 to T6 of FIGS. 9B–9G. Because only one table, Tx1, serves to represent all possible lengths of zero runs that immediately precede an effective AC coefficient, the size of the Huffman coding table set GT2 is minimized and the size of the memory required to store the Huffman coding table set GT2 is also minimized.

Tables Tx7 to Tx14 represent the Huffman code values of the group numbers that are immediately preceded by an effective AC coefficient of group numbers "7" to "14".

Table Tx15 represents the Huffman code values of the group numbers that are immediately preceded by an effective AC coefficient of any of the group numbers "15", "16" or "17". Because effective AC coefficients of group numbers "15","16" and "17" have the least frequency of occurrence, the Huffman coding values that represent the group numbers "0" to "17" that immediately precede these group numbers are combined into the one table Tx15 to further reduce the size of the coding table set GT2 and likewise reduce the size of the memory required.

The Huffman code values shown in the tables Tx0 to Tx1 and Tx7 to Tx15 of the Huffman coding set GT2 are determined for the luminance signal of the video image. Similar Huffman coding table sets are determined for the chrominance or color difference signals.

Figure 11:
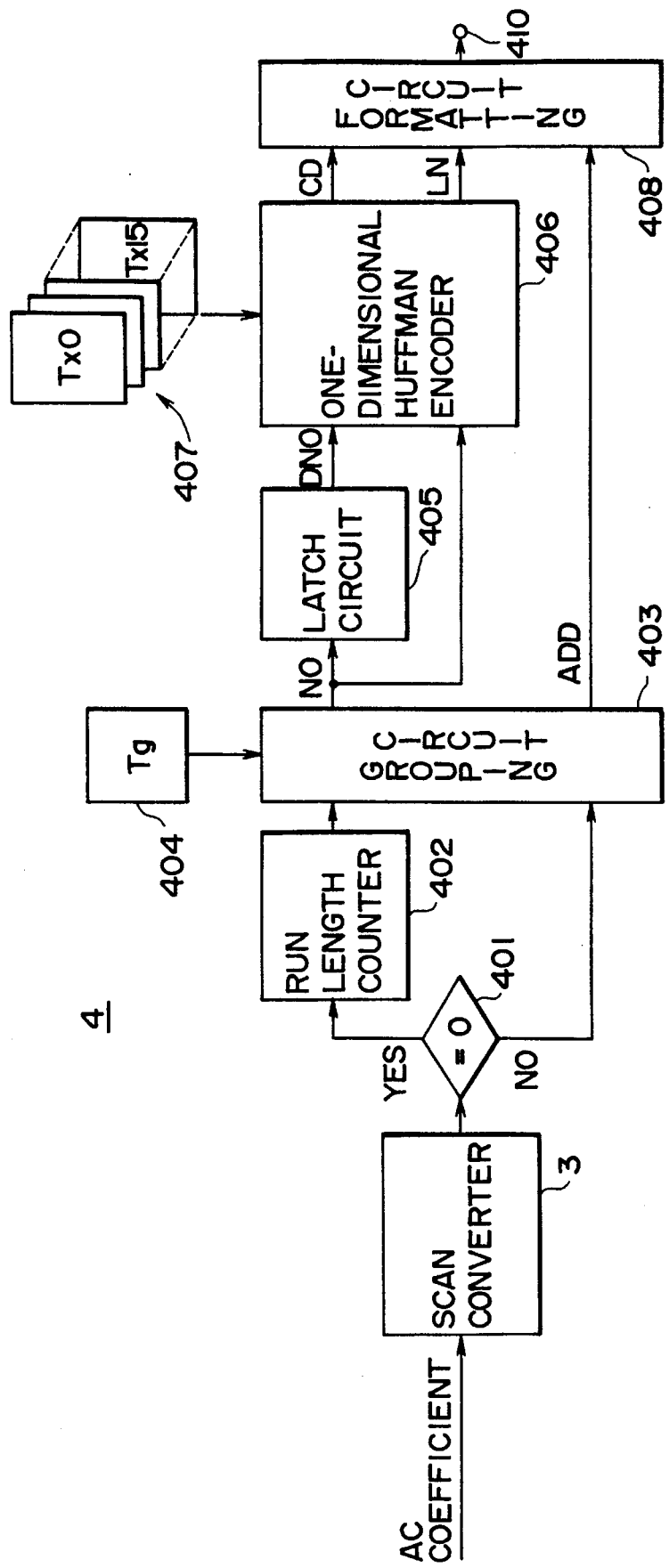
FIG. 11 is a block diagram showing a variable length code encoding circuit according to an embodiment of the present invention.

FIG. 11 is a block diagram showing the AC encoding portion of the variable length encoding circuit 4 shown in FIG. 1 according to an embodiment of the present invention. In FIG. 11, the operation of the scan converter 3 is identical to that shown in FIG. 1 and a description thereof is omitted.

The encoding circuit shown in FIG. 11 operates to encode a sequence of AC coefficients by referencing the coding table set GT2. The AC coefficients arranged by scan converter circuit 3 are supplied to a zero decision circuit 401 which determines whether a respective AC coefficient has a zero value. The decision circuit 401 supplies the AC coefficients having a zero value to a run length counter 402 which counts successive zero value AC coefficients and which supplies the count of successive zero value AC coefficients, namely the zero run length, to a grouping circuit 403.

The decision circuit 401 delivers the AC coefficients having a non-zero value, namely the effective AC coefficients, to the grouping circuit 403. The grouping circuit 403 groups the zero run lengths and the effective AC coefficients by referencing the grouping table Tg, shown in FIG. 8, which is stored in a grouping table memory 404 which, for example, may be a ROM.

The grouping circuit 403 delivers the group number for each zero run length and each effective AC coefficient to a one-dimensional Huffman encoder 406. The grouping circuit 403 also supplies each respective group number to a latch circuit 405 which delivers a previously delayed group number to the one-dimensional Huffman encoder 406 and delays the respective group number for subsequent delivery to the one-dimensional Huffman encoder 406 for a time period corresponding to the time required to encode one sampled AC coefficient. If the respective group number delivered by the grouping circuit 403 represents the first AC coefficient of the sequence, the latch circuit 405 delivers a value "0" to the one-dimensional Huffman encoder 406 to represent the delayed group number of an immediately preceding end of block flag EOB.

The one-dimensional Huffman encoder 406 assigns a Huffman code value to each zero run length and each effective AC coefficient by referencing the Huffman coding table set GT2, shown in FIGS. 10A–10B, which is stored in coding table memory 407 (for example, a ROM). The one-dimensional Huffman encoder 406 assigns the Huffman code value as a function of the respective group number and the delayed group number, namely the effective AC coefficient or the zero run length that immediately precedes the effective AC coefficient or the zero run length of the respective group number. The one-dimensional Huffman encoder 406 delivers the Huffman code value in the form of a coded word Cd and its length Ln to a formatting circuit 408.

The grouping circuit 403 also delivers the additional bits Add that correspond to each respective group number to the formatting circuit 408 which combines the coded word Cd and the additional bits Add and formats the combined coded words and additional bits. The formatting circuit 408 outputs these combined signals via output terminal 410 for subsequent transmission or recording on a recording medium. The formatting circuit 408 also appends the end of block flag EOB to the coded word Cd and additional bits Add of the last AC coefficient in the sequence and outputs the flag EOB via output terminal 410.

Figure 12A:
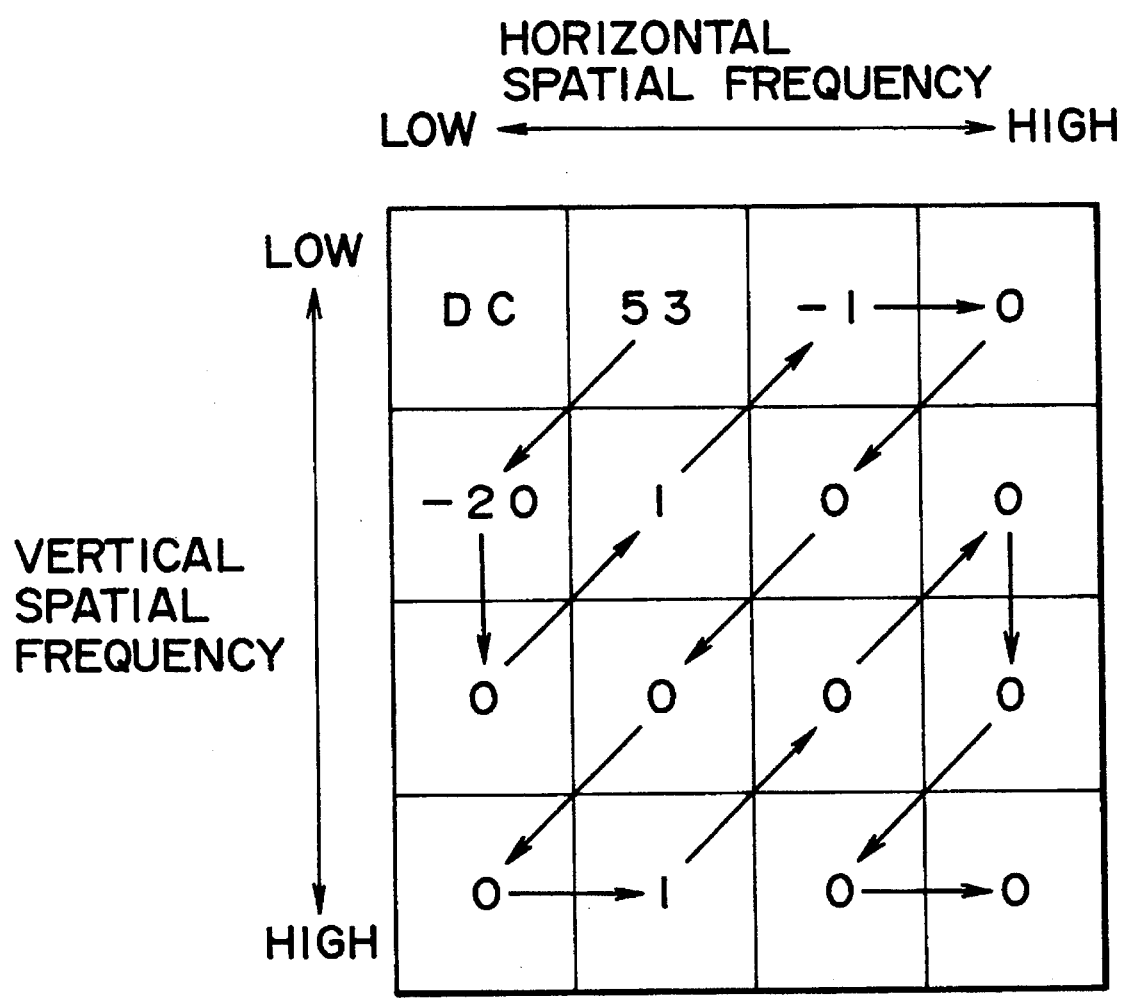

FIGS. 12A–12B show an example of a sequence of data which is grouped and encoded by the encoding circuit of FIG. 11 in accordance with the Huffman coding table set GT2. As shown in FIG. 12A, the DCT coefficients of the block are represented as a function of horizontal and vertical spatial frequency. For simplicity, a block comprised of 16 DCT coefficients is shown, though the operation of the circuit shown in FIG. 11 is not limited to blocks of this size.

The scan converter circuit 3, shown in FIG. 11, sequences the 15 AC coefficients of the block in the order of increasing horizontal and vertical spatial frequency, as represented by the zigzag pattern shown in FIG. 12A and enumerated in FIG. 12B(a). The scan converter circuit 3 supplies the sequence of AC coefficients as indicated in FIG. 12B(a) to the decision circuit 401 which, in turn, delivers the effective AC coefficients to the grouping circuit 403 and delivers the zero value AC coefficients to the run length counter 402. The run length counter 402 counts and delivers the zero run lengths to the grouping circuit 403.

The grouping circuit 403 forms the grouping sequence of the zero run lengths and the effective AC coefficients, as represented by FIG. 12B(b), and assigns the respective group numbers, as indicated in FIG. 12B(c), to each value of the grouping sequence by referencing the grouping table Tg shown in FIG. 8.

The grouping circuit 403 delivers the sequence of group numbers to the latch circuit 405 and to the one-dimensional Huffman encoder 406. The latch circuit 405 delays the sequence of group numbers to form a sequence of delayed group numbers, as represented by FIG. 12B(d), and delivers the delayed group numbers to the one-dimensional Huffman encoder circuit 406.

The one-dimensional Huffman encoder circuit 406 selects one of the tables Tx0 to Tx1 and Tx7 to Tx15 of the Huffman coding table set GT2, shown in FIGS. 10A–10B, as a function of the delayed group number. As indicated in FIG. 12B(e), the selected table number is generally identical to the delayed group number of FIG. 12B(d), except that the table Tx1 is substituted for delayed group numbers having values "1" to "6". The encoder 406 selects the Huffman code value corresponding to the respective group number from the selected coding table. The selected Huffman code values are shown in FIG. 12B(f) and are delivered by the encoder 406 to the formatting circuit 408.

The grouping circuit 403 also delivers the additional bits shown in FIG. 12B(g) to the formatting circuit 408. The formatting circuit 408 combines the respective Huffman code values and the additional bits to form the variable length code values shown in FIG. 12B(h).

In particular, the first AC coefficient of the sequence shown in FIGS. 12A and 12B(a) has the value "53" and corresponds to group number "12" shown in FIG. 12B(c) having additional bits "0101011" as shown in FIG. 12B(g) Because the AC coefficient "53" is the first value of a sequence, the delayed group number "0" is assigned by the latch circuit 405, as shown in FIG. 12B(d), and table number Tx0, shown in FIG. 12B(e), of the Huffman coding table set GT2, shown in FIGS. 10A–10B is selected. The Huffman code value "101" shown in FIG. 12B(f), which corresponds to the group number "12", is selected from the table Tx0. The Huffman code value "101" is combined with additional bits "010101" to form the variable length code "101010101" as shown in FIG. 12B(h)

Similarly, the second AC coefficient "–20" corresponds to the group number "11" the delayed group number "12" and the additional bits "10100" The Huffman code "01" which corresponds to the group number "11" is selected from table number Tx12. The Huffman code value and the additional bits are combined to form valuable length code "0110100"

Likewise, the group numbers, the additional bits, the delayed group numbers, the coding table numbers and the Huffman code values are determined for the remaining AC coefficients of the sequence shown in FIG. 12B(a) to form the remainder of the sequence of variable length code values shown in FIG. 12B(h).

In one embodiment, at least encoder 406 is implemented as a microprocessor, ALU, or the like; and preferably, the encoding circuit represented by FIG. 11 is in the form of a microprocessor programmed to carry out the operations discussed above.

Figure 7:
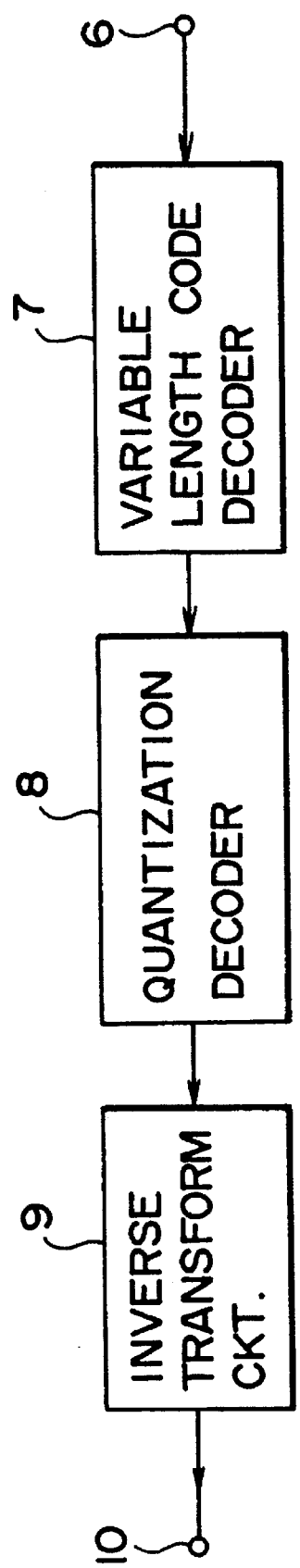
FIG. 7 is a block diagram showing a known decoding circuit.
Figure 13:
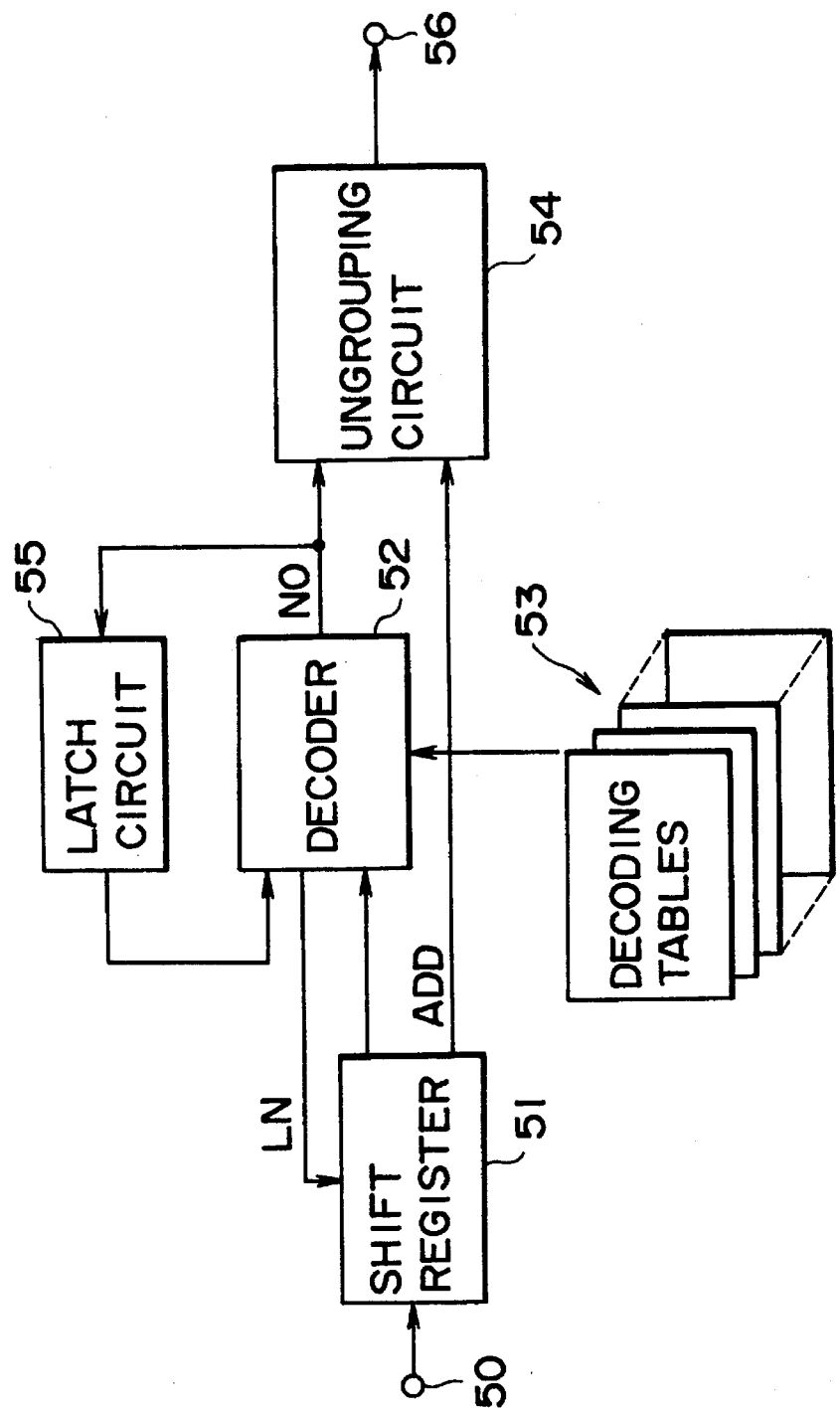
FIG. 13 is a block diagram showing a variable length code decoding circuit according to an embodiment of the present invention.

FIG. 13 is a block diagram showing in greater detail the AC decoding portion of the variable length code decoder shown in FIG. 7 according to an embodiment of the present invention. As shown in FIG. 13, the encoded AC coefficients of the variable length encoded signals are supplied to an input terminal 50 and delivered to a shift register 51. The shift register 51 delivers one of the variable length encoded signals to a decoder circuit 52 which references a set of decoding tables stored in decoding table memory 53 (e.g. a ROM) to determine a Huffman code value and the corresponding group number from the variable length code value and a previously determined group number. The decoding tables correspond to the Huffman coding table set GT2, shown in FIGS. 10A–10B.

The decoder circuit 52 delivers the group number to a latch circuit 55 which delays the group number by a time period equivalent to the time required to process a variable length code value and delivers the delayed group number back to the decoder 52 to represent the previously determined group number. The decoder 52 also delivers the group number to an ungrouping circuit 54.

The decoder circuit 52 also determines the word length Ln of the Huffman code value by referencing the decoding tables and delivers the word length Ln to the shift register 51. The shift register 51 delivers the additional bits to the ungrouping circuit 54 as a function of the word length Ln. The ungrouping circuit 54 determines the value of the AC coefficient as a function of the group number and the additional bits by referencing a grouping table which corresponds to the grouping table shown in FIG. 8 and delivers the AC coefficient to an output terminal 56.

The operation of the shift register 51, the decoder circuit 52 and the ungrouping circuit 54 is now explained in greater detail with reference to the example of FIG. 12.

The shift register 51 delivers the value "101010101", shown in FIG. 12B(h), to the decoder 52. The value "101010101" is the variable length code value of the first effective AC coefficient or zero run length of the sequence of AC coefficients, and thus the value "0" is assigned by the latch circuit 55 to the decoder circuit 52 to represent the previously determined group number.

The decoder circuit 52 selects the coding table Tx0 as a function of the previously determined group number and attempts to match a portion of the variable length code "101010101" with the Huffman code values of a table corresponding to table number Tx0 of FIG. 10A. As shown in FIG. 10A, the first 3 bits of the valuable length code "101010101" namely "101", match the Huffman code value which corresponds to group number "12". The decoder circuit 52 thereby determines that the Huffman code value is "101" and the group number has the value "12". As a result, the decoder circuit 52 determines that the final 6 bits "010101" of the variable length code value "101010101" are additional bits and delivers the word length Ln value "6" to the shift register 51.

The shift register 51 delivers the six additional bits "010101" to the ungrouping circuit 54 which determines the zero run length or the value of the AC coefficient from the group number "12" and the additional bits "010101". The group number "12", as shown in FIG. 8, is comprised of the values "–63" to "–32" and of the values "32" to "63". The ungrouping circuit 54, which determines the sign of the AC coefficient from the most significant bit of the additional bits such that "0" represents a positive value and "1" represents a negative value, determines the AC coefficient has a positive value and then determines the ordinal position of the AC coefficient from the value "32" as a function of the five least significant ones of the additional bits Thus, the ungrouping circuit 54 determines that the AC coefficient has a value of "53". It will be appreciated that decoder 52 and ungrouping circuit 54 may be implemented as a microprocessor.

The circuit shown in FIG. 13 determines the values of the AC coefficients of the remaining variable length code values shown in FIG. 12B(h) in a similar manner.

Although an illustrative embodiment of the present invention, and various modifications thereof, have been described in detail herein with reference to the accompanying drawings, it is to be understood that the invention is not limited to this precise embodiment and the described modifications, and that various changes and further modifications may be effected therein by one skilled in the art without departing from the scope or spirit of the invention as defined in the appended claims.

What is claimed is:

1. A method of encoding digital signals representing at least a portion of a video image, comprising the steps of:
   orthogonally transforming said digital signals to generate a plurality of transformation coefficients;
   arranging a portion of said transformation coefficients in a predetermined order;
   representing each respective transformation coefficient of said portion with a group value corresponding to one of a set of predefined groups, said set of predefined groups including groups formed of respective ranges of values of zero run lengths representing successive transformation coefficients of said portion having a value of zero and including groups formed of respective ranges of values of said transformation coefficients of said portion having a non-zero value;
   providing a data table previously generated as a function of a frequency of occurrence of a combination of said group value and a corresponding prior group value representing the group value of a transformation coefficient that immediately precedes said respective transformation coefficient in said predetermined order; and
   assigning a respective coding value from said data table to said each respective transformation coefficient as a function of said respective group value and said corresponding prior group value.

2. A method according to claim 1, wherein said step of orthogonally transforming a part of said digital signals includes discrete cosine transforming (DCT) said digital signals to generate a plurality of DCT coefficients.

3. A method according to claim 2, wherein said DCT coefficients include a DC coefficient and AC coefficients, and said step of arranging a portion of said transformation coefficients includes arranging said AC coefficients in said predefined order.

4. A method according to claim 3, wherein said AC coefficients are arranged in order of spatial frequency.

5. A method according to claim 1, further comprising the step of quantizing said plurality of transformation coefficients prior to arranging a portion of said transformation coefficients in said predetermined order.

6. A method according to claim 1, further comprising the step of counting successive ones of said portion of said transformation coefficients having a value of zero to generate said zero run lengths.

7. A method according to claim 1, wherein said data table is generated such that respective combinations having said prior group values which represent respective ranges of values of said zero run lengths correspond to an identical coding value for each respective group value.

8. A method according to claim 1, wherein said data table is generated such that respective sets of combinations having a lower frequency of occurrence correspond to an identical coding value.

9. A method according to claim 1, wherein said step of assigning a respective coding value includes assigning a Huffman code value for said each transformation coefficient.

10. A method according to claim 1, wherein said coding value comprises a first segment derived from said data table as a function of said respective group value and as a function of said prior group value.

11. A method according to claim 10, wherein said coding value further comprises a second segment which indicates an ordinal position within said corresponding group of a value of said each transformation coefficient.

12. A method according to claim 11, wherein said second segment comprises a predetermined number of bits, said number of bits increasing with decreasing frequency of occurrence of the value of said each transformation coefficient.

13. A method according to claim 10, wherein said step of assigning a respective coding value includes assigning a Huffman code value for said each transformation coefficient and assigning a length indicator representing the length of said Huffman code value, and said first segment includes said Huffman code value.

14. A method according to claim 1, wherein said data table is generated for one of luminance digital signals and chrominance digital signals.

15. An apparatus for encoding digital signals representing at least a portion of a video image, comprising:
   means for orthogonally transforming said digital signals to generate a plurality of transformation coefficients;
   means for arranging a portion of said transformation coefficients in a predetermined order;
   means for representing each respective transformation coefficient of said portion with a group value corresponding to one of a set of predefined groups, said set of predefined groups including groups formed of respective ranges of values of zero run lengths representing successive transformation coefficients of said portion having a value of zero and including groups formed of respective ranges of values of said transformation coefficients of said portion having a non-zero value;
   means for providing a data table previously generated as a function of a frequency of occurrence of a combination of said group value and a corresponding prior group value representing the group value of a transformation coefficient that immediately precedes said respective transformation coefficient in said predetermined order; and
   means for assigning a respective coding value from said data table to said each respective transformation coefficient as a function of said respective group value and said corresponding prior group value.

16. An apparatus according to claim 15, wherein said means for orthogonally transforming a part of said digital signals operates to discrete cosine transform said digital signals to generate a plurality of DCT coefficients.

17. An apparatus according to claim 16, wherein said DCT coefficients include a DC coefficient and AC coefficients, and said means for arranging a portion of said transformation coefficients operates to arrange said AC coefficients in said predetermined order.

18. An apparatus according to claim 17, wherein said AC coefficients are arranged in order of spatial frequency.

19. An apparatus according to claim 15, further comprising means for quantizing said plurality of transformation coefficients.

20. An apparatus according to claim 15, further comprising means for counting successive ones of said portion of said transformation coefficients having a value of zero to generate said zero run lengths.

21. An apparatus according to claim 15, wherein said data table is generated such that respective combinations having said prior group values which represent respective ranges of values of said zero run lengths correspond to an identical coding value for each respective group value.

22. An apparatus according to claim 15, wherein said data table is generated such that respective sets of combinations having a lower frequency of occurrence correspond to an identical coding value.

23. An apparatus according to claim 15, wherein said means for assigning a respective coding value assigns a Huffman code value for said each transformation coefficient.

24. An apparatus according to claim 15, wherein said coding value comprises a first segment derived from said data table as a function of said respective group value and as a function of said prior group value.

25. An apparatus according to claim 24, wherein said coding value further comprises a second segment which indicates an ordinal position within said corresponding group of a value of said each transformation coefficient.

26. An apparatus according to claim 25, wherein said second segment comprises a predetermined number of bits, said number of bits increasing with decreasing frequency of occurrence of the value of said each transformation coefficient.

27. An apparatus according to claim 24, wherein said means for assigning a respective coding value operates to assign a Huffman code value for said each transformation coefficient and to assign a length indicator representing the length of said Huffman code value, and said first segment includes said Huffman code value.

28. An apparatus according to claim 15, wherein said data table is generated for one of luminance digital signals and chrominance digital signals.

29. A method of recording digital signals representing a video image, comprising the steps of:

orthogonally transforming said digital signals to generate a plurality of transformation coefficients;

arranging a portion of said transformation coefficients in a predetermined order;

representing each respective transformation coefficient of said portion with a group value corresponding to one of a set of predefined groups, said set of predefined groups including groups formed of respective ranges of values of zero run lengths representing successive transformation coefficients of said portion having a value of zero and including groups formed of respective ranges of values of said transformation coefficients of said portion having a non-zero value;

providing a data table previously generated as a function of a frequency of occurrence of a combination of said group value and a corresponding prior group value representing the group value of a transformation coefficient that immediately precedes said respective transformation coefficient in said predetermined order;

assigning a respective coding value from said data table to said each respective transformation coefficient as a function of said respective group value and said corresponding prior group value;

formatting coded signals each representing said respective coding value; and recording said formatted coded signals on a recording medium.

30. An apparatus for recording digital signals representing a video image, comprising:

means for orthogonally transforming said digital signals to generate a plurality of transformation coefficients;

means for arranging a portion of said transformation coefficients in a predetermined order;

means for representing each respective transformation coefficient of said portion with a group value corresponding to one of a set of predefined groups, said set of predefined groups including groups formed of respective ranges of values of zero run lengths representing successive transformation coefficients of said portion having a value of zero and including groups formed of respective ranges of values of said transformation coefficients of said portion having a non-zero value;

means for providing a data table previously generated as a function of a frequency of occurrence of a combination of said group value and a corresponding prior group value representing the group value of a transformation coefficient that immediately precedes said respective transformation coefficient in said predetermined order;

means for assigning a respective coding value from said data table to said each respective transformation coefficient as a function of said respective group value and said corresponding prior group value;

means for formatting coded signals each representing said respective coding value; and means for recording said formatted coded signals on a recording medium.

31. A method of transmitting digital signals representing a video image, comprising the steps of:

orthogonally transforming said digital signals to generate a plurality of transformation coefficients;

arranging a portion of said transformation coefficients in a predetermined order;

representing each respective transformation coefficient of said portion with a group value corresponding to one of a set of predefined groups, said set of predefined groups including groups formed of respective ranges of values of zero run lengths representing successive transformation coefficients of said portion having a value of zero and including groups formed of respective ranges of values of said transformation coefficients of said portion having a non-zero value;

providing a data table previously generated as a function of a frequency of occurrence of a combination of said group value and a corresponding prior group value representing the group value of a transformation coefficient that immediately precedes said respective transformation coefficient in said predetermined order;

assigning a respective coding value from said data table to said each respective transformation coefficient as a function of said respective group value and said corresponding prior group value;

formatting coded signals each representing said respective coding value; and transmitting said formatted coded signals.

32. An apparatus for transmitting digital signals representing a video image, comprising:

means for orthogonally transforming said digital signals to generate a plurality of transformation coefficients;

means for arranging a portion of said transformation coefficients in a predetermined order;

means for representing each respective transformation coefficient of said portion with a group value corresponding to one of a set of predefined groups, said set of predefined groups including groups formed of respective ranges of values of zero run lengths representing successive transformation coefficients of said portion having a value of zero and including groups formed of respective ranges of values of said transformation coefficients of said portion having a non-zero value;

means for providing a data table previously generated as a function of a frequency of occurrence of a combination of said group value and a corresponding prior group value representing the group value of a transformation coefficient that immediately precedes said respective transformation coefficient in said predetermined order;

means for assigning a respective coding value from said data table to said each respective transformation coefficient as a function of said respective group value and said corresponding prior group value;

means for formatting coded signals each representing said respective coding value; and means for transmitting said formatted coded signals.

33. A method of decoding digital signals representing a video image, said digital signals being encoded representations of orthogonal transform coefficients. arranged in a predetermined order with each transform coefficient being represented by a group value corresponding to one of a set of predefined groups. said set including groups formed of respective ranges of values of zero run lengths and groups formed of respective ranges Of values of non-zero coefficients., and said digital signals comprising one segment to identify a group and another segment to identify a Huffman code value, said method comprising the steps of:

recovering segments from said digital signals;

determining the group value of the encoded digital signal from a prederived data table as a function of the group identifying segment and from a corresponding previously determined group value;

generating an orthogonal transformation coefficient as a function of said Huffman code identifying segment and said determined group value; and inverse orthogonally transforming said orthogonal transformation coefficients to generate a decoded digital video signal.

34. A method according to claim 33, wherein said step of determining the group values includes deriving a length indicator representing the length of said Huffman code value as a function of said Huffman code value and said previously determined group value.

35. A method according to claim 34, wherein said Huffman code identifying segment indicates an ordinal position within said group of a value of said transformation coefficient, and said step of generating orthogonal transformation coefficients includes deriving said orthogonal transformation coefficients from said Huffman code identifying segment and said group value.

36. A method according to claim 33, wherein said prederived data table is a function of a frequency of occurrence of a respective combination of said determined group value and said previously determined group value.

37. An apparatus for decoding digital signals representing a video image, aid digital signals being encoded representations of orthogonal transform coefficients arranged in predetermined order with each transform coefficient being represented by group value corresponding to one of a set of predefined groups, said set including groups formed of respective ranges of vales of zero run lengths and groups formed of respective ranges of values of non-zero coefficients, and said digital signals comprising one segment to identify a group and another segment to identify a Huffman code value, said apparatus comprising:

means for recovering segments from said digital signals;

means for determining the group value of the encoded digital signal from a prederived data table as a function of the group identifying segment and from a corresponding previously determined group value;

means for generating an orthogonal transformation coefficient as a function of said Huffman code identifying segment and said determined group value and means for inverse orthogonally transforming said orthogonal transformation coefficients to generate a decoded digital video signal.

38. An apparatus according to claim 37, wherein said means for determining the group values operates to derive a length indicator representing the length of said Huffman code value as a function of said Huffman code value and said previously determined group value.

39. An apparatus according to claim 38, wherein said Huffman code identifying segment indicates an ordinal position within said group of a value of said transformation coefficient, and said means for generating orthogonal transformation coefficients operates to derive said orthogonal transformation coefficients from said Huffman code identifying segment and said group value.

40. An apparatus according to claim 37, wherein said prederived data table is a function of a frequency of occurrence of a respective combination of said determined group value and said previously determined group value.

41. A method of reproducing digital signals recorded on a record medium in the form of formatted signals representing a video image, said digital signals being encoded representations of orthogonal transform coefficients arranged in a predetermined order with each transform coefficient being represented by a group vale corresponding to one of a set of predefined groups, said set including groups formed of respective ranges of values of zero run lengths and groups formed of respective ranges of values of non-zero coefficients, and said digital signals comprising one segment to identify a group and another segment to identify a Huffman code value, said method comprising the steps of:

reading said formatted signals from said record medium;

recovering segments from said formatted signals;

determining the group value of the encoded digit signal from a prederived data table as a function of the group identifying segment and from a corresponding previously determined group value;

generating an orthogonal transformation coefficient as a function of said Huffman code identifying segment and said determined group value; and inverse orthogonally transforming said orthogonal transformation coefficients to generate a decoded digital video signal.

42. Apparatus for reproducing digital signals recorded on a record medium in the form of formatted signals representing a video image, aid digital signals being encoded representations of orthogonal transform coefficients arranged in a predetermined order with each transform coefficient being represented by a group value corresponding to one of a set of predefined groups, said set including groups formed of respective ranges of values of zero run lengths and groups formed of respective ranges of values of non-zero coefficients, and said digital signals comprising one segment to identify a group and another segment to identify a Huffman code value, said apparatus comprising:

means for reading said formatted signals from said record medium;

means for recovering segment from said formatted signals;

means for determining the group value of the encoded digital signal from a prederived data table as a function of the group identifying segment and from a corresponding previously determined group value;

means for generating an orthogonal transformation coefficient as a function of said Huffman code identifying segment and said determined group value; and means for inverse orthogonally transforming said orthogonal transformation coefficients to generate a decoded digital video signal.

43. A method of reproducing digital signals from signals transmitted in the form of formatted signals representing a video image, said digital signals being encoded representations of orthogonal transform coefficients arranged in a predetermined order with each transform coefficient being represented by a group value corresponding to one of a set of predefined groups, said set including groups formed of respective ranges of values of zero run lengths and groups formed of respective ranges of values of non-zero coefficients, and said digital signals comprising one segment to identify a group and another segment to identify Huffman code value, said method comprising the steps of:

receiving said formatted signals;

recovering segments from said formatted signals;

determining the group value of the encoded digital signal from a prederived data table as a function of the group identifying segment and from a corresponding previously determined group value;

generating an orthogonal transformation coefficient as a function of said Huffman code identifying segment and said determined group value; and inverse orthogonally transforming said orthogonal transformation coefficients to generate a decoded digital video signal.

44. Apparatus for reproducing digital signals from signals transmitted in the form of formatted signals representing a video image, said digital signals being encoded representations of orthogonal transform coefficients arranged in a predetermined order with each transform coefficient being represented by a group value corresponding to one of a set of predefined groups, said set including groups formed of respective ranges of values of zero run lengths and groups formed of respective ranges of values of non-zero coefficients, and said digital signals comprising one segment to identify group and another segment to identify a Huffman code value, said apparatus comprising:

means for receiving said formatted signals;

means for recovering segments from said formatted signals;

means for determining the group value of the encoded digital signal from a prederived data table as a function of the group identifying segment and from a corresponding previously determined group value;

means for generating an orthogonal transformation coefficient as a function of said Huffman code identifying segment and said determined group value; and means for inverse orthogonally transforming said orthogonal transformation coefficients to generate a decoded digital video signal.

45. A method of recording and reproducing digital signals representing a video image, comprising the steps of:

orthogonally transforming said digital signals to generate a plurality of transformation coefficients;

arranging a portion of said transformation coefficients in a predetermined order;

representing each respective transformation coefficient of said portion with a group value corresponding to one of a set of predefined groups, said set of predefined groups including groups formed of respective ranges of values of zero run lengths representing successive transformation coefficients of said portion having a value of zero and including groups formed of respective ranges of values of said transformation coefficients of said portion having a non-zero value;

providing a data table previously generated as a function of a frequency of occurrence of a combination of said group value and a corresponding prior group value representing the group value of a said transformation coefficient that immediately precedes said respective transformation coefficient in said predetermined order;

assigning a respective coding value from said data table to said each respective transformation coefficient as a function of said respective group value and said corresponding prior group value;

formatting coded signals each representing said respective coding value;

recording said formatted signals on a record medium;

reading said formatted signals from said record medium;

recovering coding values from said formatted signals;

determining respective group values from a prederived data table as a function of respective ones of said coding values and from a corresponding previously determined group value, each said group value representing one of a set of predefined groups;

generating orthogonal transformation coefficients each derived as a function of said respective coding value and said respective group value derived from said respective coding value; and inverse orthogonally transforming said orthogonal transformation coefficients to generate a decoded digital video signal.

46. An apparatus for recording and reproducing digital signals representing a video image, comprising:

means for orthogonally transforming said digital signals to generate a plurality of transformation coefficients;

means for arranging a portion of said transformation coefficients in a predetermined order;

means for representing each respective transformation coefficient of said portion with a group value corresponding to one of a set of predefined groups, said set of predefined groups including groups formed of respective ranges of values of zero run lengths representing successive transformation coefficients of said portion having a value of zero and including groups formed of respective ranges of values of said transformation coefficients of said portion having a non-zero value;

means for providing a data table previously generated as a function of a frequency of occurrence of a combination of said group value and a corresponding prior group value representing the group value of said transformation coefficient that immediately precedes said respective transformation coefficient in said predetermined order;

means for assigning a respective coding value from said data table to said each respective transformation coefficient as a function of said respective group value and said corresponding prior group value;

means for formatting coded signals each representing said respective coding value;

means for recording said formatted signals on a record medium;

means for reading said formatted signals from said record medium;

means for recovering coding values from said formatted signals;

means for determining respective group values from a prederived data table as a function of respective ones of said coding values and from a corresponding previously determined group value, each said group value representing one of a set of predefined groups;

means for generating orthogonal transformation coefficients each derived as a function of said respective coding value and said respective group value derived from said respective coding value; and means for inverse orthogonally transforming said orthogonal transformation coefficients to generate a decoded digital video signal.

* * * * *